(12) United States Patent
Kim et al.

(10) Patent No.: US 6,677,174 B2
(45) Date of Patent: *Jan. 13, 2004

(54) METHOD FOR PATTERNING DEVICES

(75) Inventors: Changsoon Kim, Princeton, NJ (US); Paul E. Burrows, Kennewick, WA (US); Stephen R. Forrest, Princeton, NJ (US); Theodore Zhou, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/100,866

(22) Filed: Mar. 19, 2002

(65) Prior Publication Data

US 2002/0094594 A1 Jul. 18, 2002

Related U.S. Application Data

(63) Continuation of application No. 09/718,215, filed on Nov. 21, 2000, now Pat. No. 6,468,819, which is a continuation-in-part of application No. 09/447,793, filed on Nov. 23, 1999, now Pat. No. 6,294,398.

(51) Int. Cl.$^7$ .............................................. H01L 21/00
(52) U.S. Cl. ............................ 438/22; 438/34; 438/39; 438/458
(58) Field of Search .................... 438/22, 28, 29, 438/34, 39, 455, 458, 459

(56) References Cited

U.S. PATENT DOCUMENTS

| | | |
|---|---|---|
| 5,641,611 A | 6/1997 | Shieh et al. |
| 5,707,745 A | 1/1998 | Forrest et al. |
| 5,925,259 A | 7/1999 | Biebuyck et al. |
| 5,998,803 A | 12/1999 | Forrest et al. |
| 6,013,538 A | 1/2000 | Burrows et al. |
| 6,027,630 A | 2/2000 | Cohen |
| 6,190,940 B1 * | 2/2001 | DeFelice et al. ............ 438/106 |
| 6,214,631 B1 | 4/2001 | Burrows et al. |
| 6,504,096 B2 * | 1/2003 | Okubora ..................... 174/52.2 |

FOREIGN PATENT DOCUMENTS

| | | |
|---|---|---|
| WO | 96/19792 | 6/1996 |
| WO | 98/28946 | 7/1998 |

OTHER PUBLICATIONS

Kim et al., "Micropatterning of Organic Electronic Devices by Cold–Welding", *Science*, vol. 288, pp. 831–833, May 5, 2000.
Stutzmann, et al., "Patterning of polymer–supported metal films by microcutting", *Nature*, vol. 407, pp. 613–616, Oct. 5, 2000.
P.W.M. Blom et al., "Efficiency and stability of polymer light–emitting diodes", *Journals of Materials Science Materials in Electronics*, vol. 11, No. 2, Mar. 2000, pp. 105–109.
Y. Xia, et al., "Unconventional Methods for Fabricating and Patterning Nanostructures", *Chem. Rev.*, 1999, 99, pp. 1823–1848.

* cited by examiner

*Primary Examiner*—Tuan H. Nguyen
(74) *Attorney, Agent, or Firm*—Kenyon & Kenyon

(57) ABSTRACT

The present invention relates to patterning methods for organic devices, and more particularly to patterning methods using a die. A first layer of organic materials is deposited over a substrate, followed by a first electrode layer. A first patterned die having a raised portion is then pressed onto the first electrode layer, such that the raised portion of the first patterned die contacts portions of the first electrode layer. The patterned die is removed, such that the portions of the first electrode layer in contact with the raised portions of the first patterned die are removed. In one embodiment of the invention, a second organic layer is then deposited over the first electrode layer, followed by a second electrode layer. A second patterned die having a raised portion is pressed onto the second electrode layer, such that the raised portion of the second patterned die contacts portions of the second electrode layer. The second patterned die is removed, such that the portions of the second electrode layer in contact with the raised portions of the second patterned die are removed. Preferably the patterned die is coated with an adhesive material such as a metal.

6 Claims, 22 Drawing Sheets

6a

6b 8 (a)

8 (b)

9a

9b

METHOD FOR PATTERNING DEVICES

CROSS REFERENCE TO RELATED APPLICATIONS

This application is a continuation of U.S. Ser. No. 09/718, 215, filed Nov. 21, 2000, now U.S. Pat. No. 6,468,819 which is a continuation-in-part of U.S. Ser. No. 09/447,793, filed Nov. 23, 1999, now U.S. Pat. No. 6,294,398.

FIELD OF THE INVENTION

The present invention relates to patterning methods for thin films, and more particularly to patterning methods using a die.

BACKGROUND OF THE INVENTION

Organic light emitting devices (OLEDs), which make use of thin films that emit light when excited by electric current, are becoming an increasingly popular technology for applications such as flat panel displays. Popular OLED configurations include double heterostructure, single heterostructure, and single layer, as described in PCT Application WO 96/19792, which is incorporated herein by reference.

To form an array of OLEDs, the constituent materials must be patterned. Such patterning maybe achieved by photoresist methods, as disclosed by U.S. Pat. No. 5,641,611 to Shieh, and in U.S. Pat. No. 6,013,528 to Burrows et al. Shadow masks may also be used to pattern, as disclosed by co-pending U.S. patent application Ser. No. 09/182,636. Shadow masks must be thick enough to provide mechanical strength and thus, the obtainable resolution of the pattern is limited. Other methods of patterning have been used, such as excimer laser ablation and conformal masks.

While these known patterning methods are acceptable in certain circumstances, a more accurate, faster and less expensive method of patterning is desirable.

SUMMARY OF THE INVENTION

The present invention relates to patterning methods for organic devices, and more particularly to patterning methods using a die. A first layer of organic materials is deposited over a substrate, followed by a first electrode layer. A first patterned die having a raised portion is then pressed onto the first electrode layer, such that the raised portion of the first patterned die contacts portions of the first electrode layer. The patterned die is removed, such that the portions of the first electrode layer in contact with the raised portions of the first patterned die are removed. In one embodiment of the invention, a second organic layer is then deposited over the first electrode layer, followed by a second electrode layer. A second patterned die having a raised portion is pressed onto the second electrode layer, such that the raised portion of the second patterned die contacts portions of the second electrode layer. The second patterned die is removed, such that the portions of the second electrode layer in contact with the raised portions of the second patterned die are removed. Preferably the patterned die is coated with an adhesive material such as a metal.

BRIEF DESCRIPTION OF THE DRAWINGS

FIG. 8($a$) is the magnified image of the square area in FIG. 8($b$).

DETAILED DESCRIPTION

The present invention will be described with reference to the illustrative embodiments in the following processes and drawing figures.

A method is provided for patterning an electronic device using a die. The device is fabricated on top of a substrate. Prior to patterning in accordance with the present invention, patterned layers or a first electrode may be formed on the substrate using techniques known to the art. Then, a blanket layer of organic material is deposited over the substrate and any patterned layers or electrodes present thereon. Next, a blanket layer of a metal electrode material (the "top electrode layer"), is deposited over the organic layer. The top electrode layer may be for example, a cathode layer or an anode layer. The optional first electrode may also be a cathode layer or an anode layer. Preferably if the top electrode layer is a cathode layer, then the first electrode is an anode layer and vice versa.

The electronic device maybe for example an Organic Light Emitting Device (OLED) as described for example in U.S. Pat. No. 5,707,745, which is incorporated herein by reference.

The blanket layers are patterned with a die having raised and depressed portions that form a desired pattern. According to one embodiment, the die is pressed onto the blanket layers, such that the raised portions of the die compress underlying layers on the substrate. As a result, the organic layers will deform, and the top electrode layer will break at the juncture between the raised and depressed portions of the die. The raised portions of the die may be coated with a material such that the underlying portions of the top electrode layer stick to the die, and are removed when the die is lifted away. When the raised portions of the die are not coated with a material such that the underlying portions of the top electrode layer stick to the die, the compression by the die causes the top electrode layer to break, however, the residual layer of the top electrode remains part of the patterned electronic device.

The die is formed from a hard substance. Preferably, the die is made of a substance that is readily patterned. Examples of suitable materials that may be used to form dies in accordance with the present invention include silicon, glass, quartz and hard metals. Silicon is a preferred die material in the laboratory, because it is hard and readily patterned. However, different materials may be more suitable for large scale production.

Figure 1:
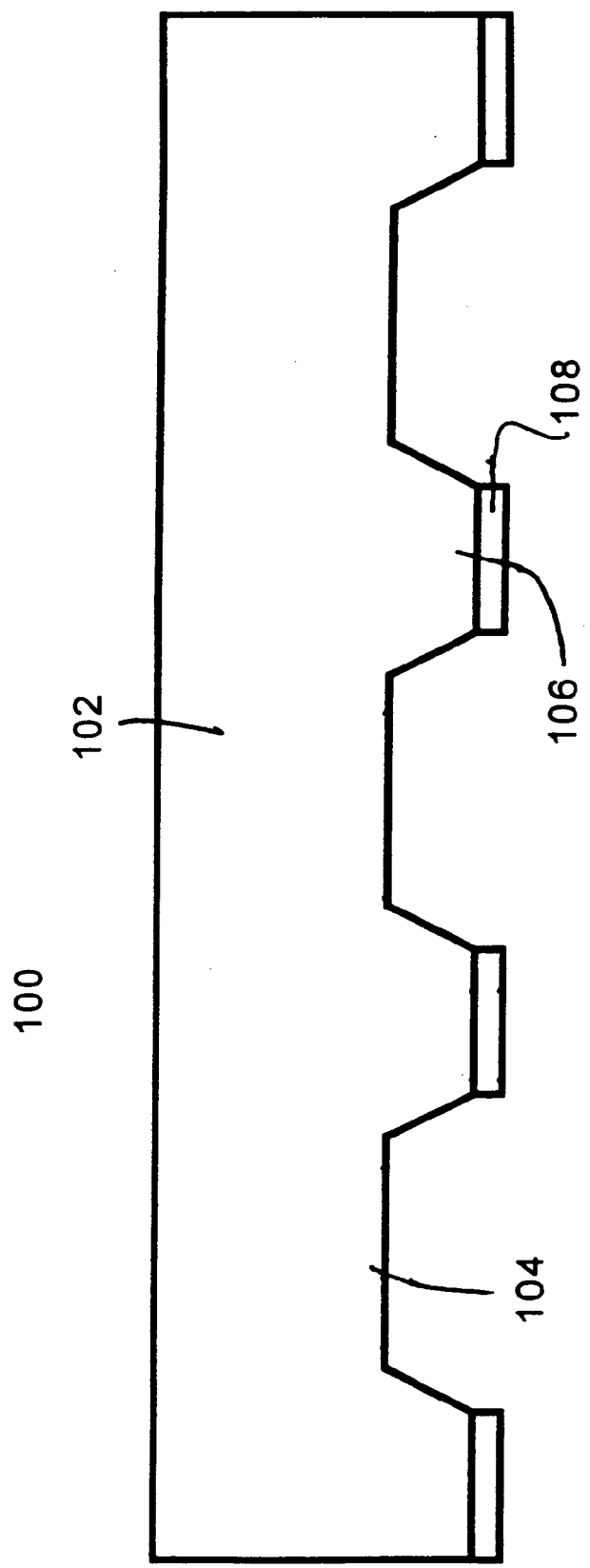
FIG. 1 shows a cross-section of a die adapted for use with the present invention.

FIG. 1 shows a cross-section of a die 100 adapted for use with the present invention. Die 100 has a body 102, formed of a hard substance. Body 102 has depressed portions 104 and raised portions 106. Depressed portions 104 and raised portions 106 may be formed using techniques known to the art, such as silicon patterning and etching processes. Raised portions 106 are coated with a coating 108. Coating 108 is adapted to adhere well to body 102. Coating 108 is also adapted to adhere well to materials such as metal and indium tin oxide (ITO). For example, coating 108 may be a metal or other pressure sensitive adhesive. In particular, if a metal is used, it should be of the same of approximately the same composition as the metal to be lifted off of the organic surface. On compression, these similar metals form a strong cold-welded bond.

Figure 2:
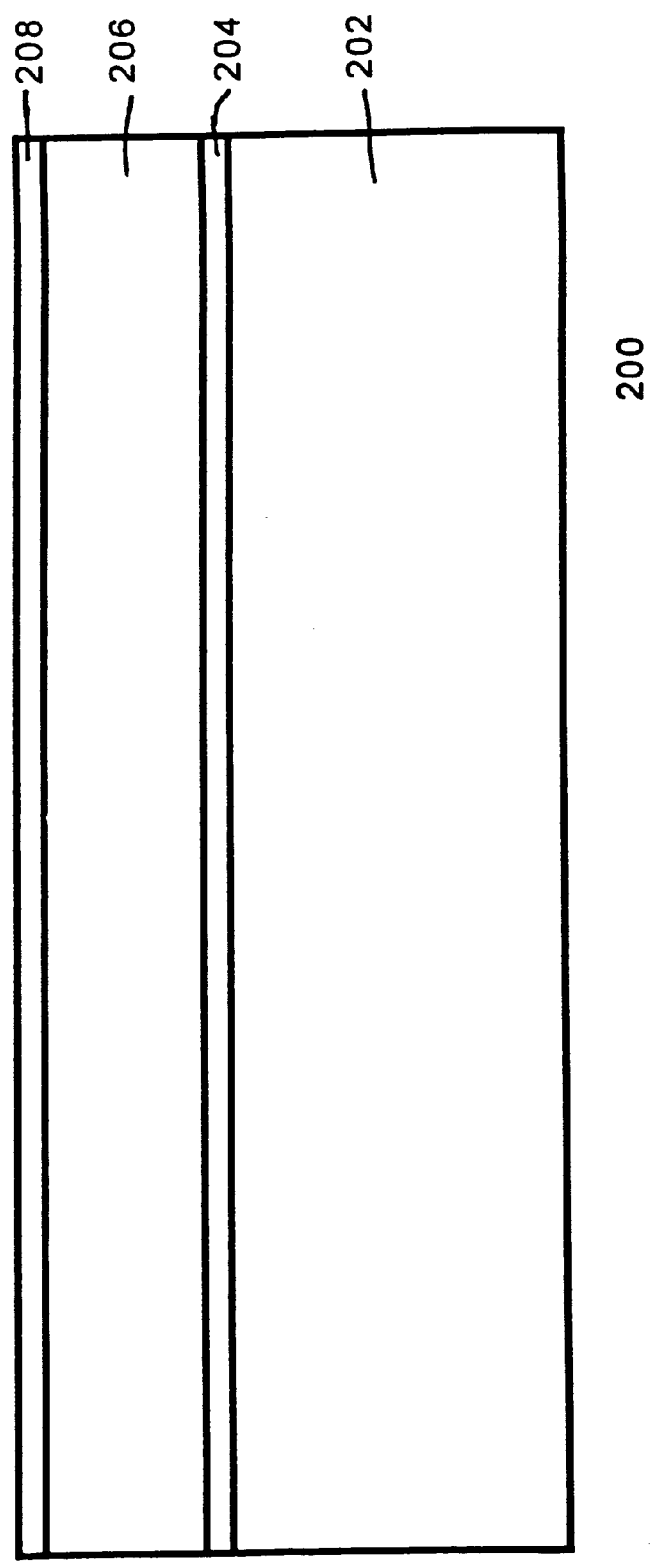
FIG. 2 shows a cross-section of a sample prior to patterning in accordance with the present invention.

FIG. 2 shows a cross-section of a sample 200 prior to patterning in accordance with the present invention. Sample 200 has a substrate 202 made of a material adapted to provide support. Substrate 202 may be made of any suitable material, including glass, polymers, and plexiglass. Substrate 202 may be rigid, flexible, opaque or transparent. Preferably, substrate 202 is made of a material such as glass or plastic. A bottom electrode 204, made of a conductive material, is deposited onto substrate 202 using techniques known to the art. Preferably, bottom electrode 204 is made of a transparent conductive material, such as ITO. In one embodiment the bottom electrode 204 may be patterned into strips, as discussed in further detail with reference to FIG. 4, using techniques known to the art. Organic layer 206 is blanket deposited over bottom electrode 204. Organic layer 206 may comprise a single layer or a plurality of layers. For example, organic layer 206 may comprise the multiple organic layers of a single or double heterostructure OLED, as described in U.S. Pat. No. 5,707,745, and which is incorporated by reference. Top electrode layer 208 is blanket deposited over organic layer 206. Top electrode layer 208 is made of a conductive material such as a metal, a metal alloy or ITO.

Figure 3:
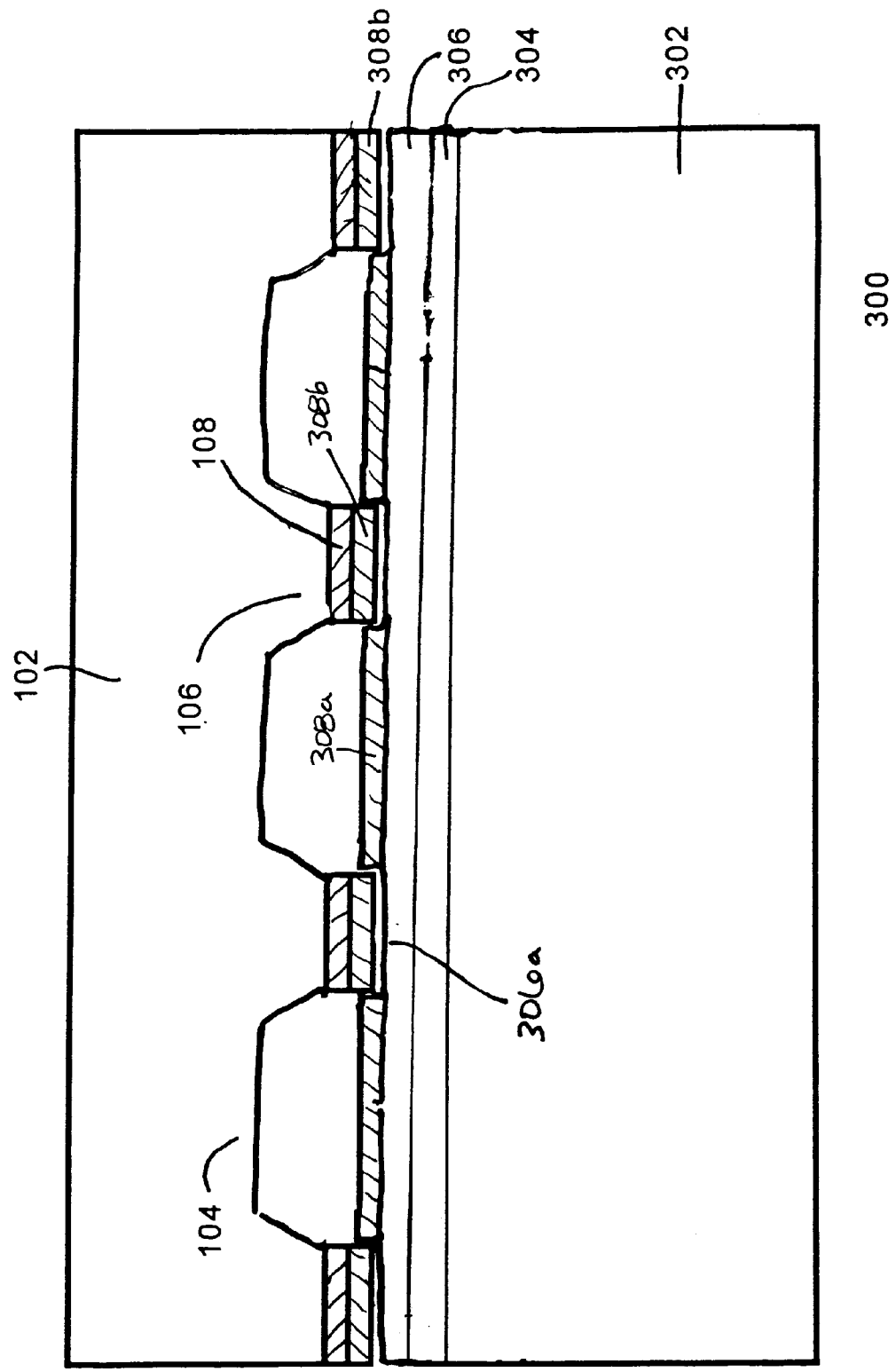
FIG. 3 shows a cross-section of the die of FIG. 1 being used to pattern a sample similar to that of FIG. 2.

FIG. 3 shows a cross-section of die 100 of FIG. 1 being used to pattern a sample 300 similar to sample 200 of FIG. 2 into an array of OLEDs. Substrate 302, bottom electrode 304, organic layer 306 (comprising regions 306a and 306b) and top electrode layer 308 (comprising top electrode 308a and region 308b) of FIG. 3 correspond to substrate 202, bottom electrode 204, organic layer 206 and top electrode layer 208 of FIG. 2.

Die 100 is pressed onto sample 300, and raised portions 106 of die 100 contacts the upper portion of sample 300. Regions 308b of top electrode layer 308 stick to coating 108, and are removed when die 100 is lifted away from sample 300. Top electrode 308a (the remaining portion of top electrode layer 308) does not stick to the die.

Figure 4:
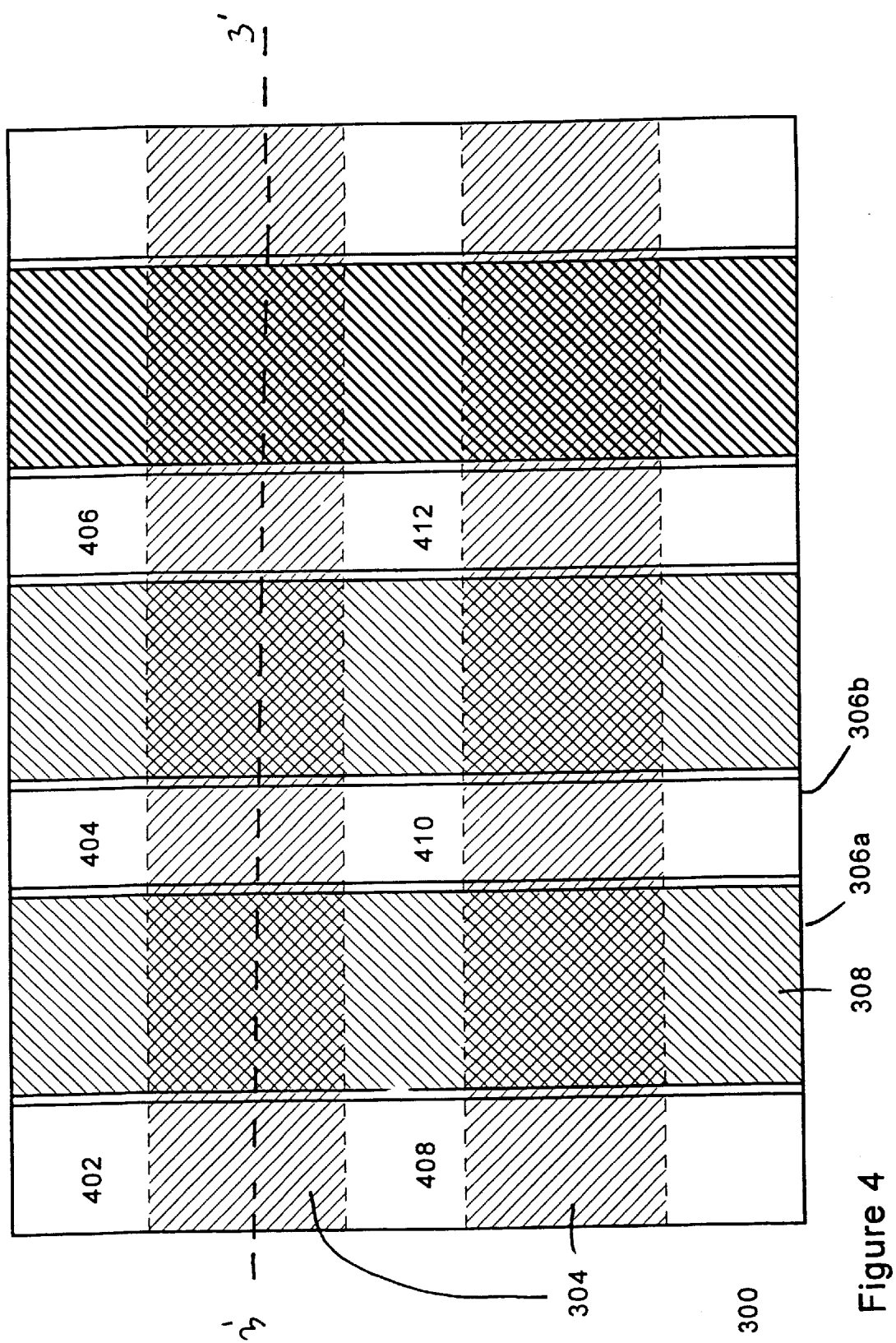
FIG. 4 shows a plan view of the sample of FIG. 3 after patterning.

FIG. 4 shows one of many possible different plan views of sample 300 after patterning as described with reference to FIG. 3. In FIG. 4, a passive display is being formulated. In particular, FIG. 3 is a cross-section of FIG. 4 through line 3'. Bottom electrodes 304 are patterned into strips using techniques known to the art, prior to the deposition of organic layer 306 and top electrode layer 308, and prior to the compression of sample 300 by die 100. After compression, top electrode layer 308 has been patterned to form top electrodes 308a. Regions 306a are exposed because regions 308b of top electrode layer 308 have been removed by die 100.

In one embodiment of the invention, Sample 300 as shown in FIG. 4 forms a 3×2 array of electronic devices. In particular, electronic devices 402, 404, 406, 408, 410 and 412 have been fabricated at the intersection of bottom electrodes 304 with top electrodes 308a. Each of these electronic may be independently addressed by controlling the voltages of bottom electrodes 304 and top electrodes 308a, using passive matrix addressing techniques known to the art.

It is to be understood that the present invention may be used to fabricate much larger arrays of organic devices than those specifically described herein. Moreover, a multi-color display may be fabricated by depositing various down-conversion layers known to the art. For example, organic layer 206 may be made of a material that emits blue light, and patterned blue-to-green and blue-to-red down conversion layers maybe deposited on substrate 202 prior to the deposition of bottom electrodes 204. These down-conversion layers maybe patterned such that an array of organic devices ultimately fabricated forms an array of three-color pixels, where each pixel comprises three organic devices—one with no down conversion layer that emits blue, one with a blue-to-green down conversion layer that emits green, and one with a blue-to-red down conversion layer that emits red.

The organic layers may emit light through any of a number of mechanisms. The emission of light is generically referred to as "luminescence." Specific luminescent mechanisms include phosphorescence and fluorescence. For purposes of the present invention, any type of luminescence may be used in any of the embodiments.

EXAMPLES

A method according to the present invention for the direct micropatterning of OLED displays by post-deposition stamping was performed. Specifically an unpatterned OLED was patterned such that a cathode layer of the OLED was selectively lifted off of an OLED by pressing a patterned silicon stamp (i.e., a die) with a metal layer, onto the unpatterned OLED. In this post-deposition stamping method, the stamp contained a metal coating, which cold welded to the cathode of the unpatterned OLED when the metal coating and the cathode were contacted with one another. When the stamp was removed from the OLED, the cathode was selectively removed from the OLED in essentially the same pattern in which the metal was placed on the stamp.

Figure 5:
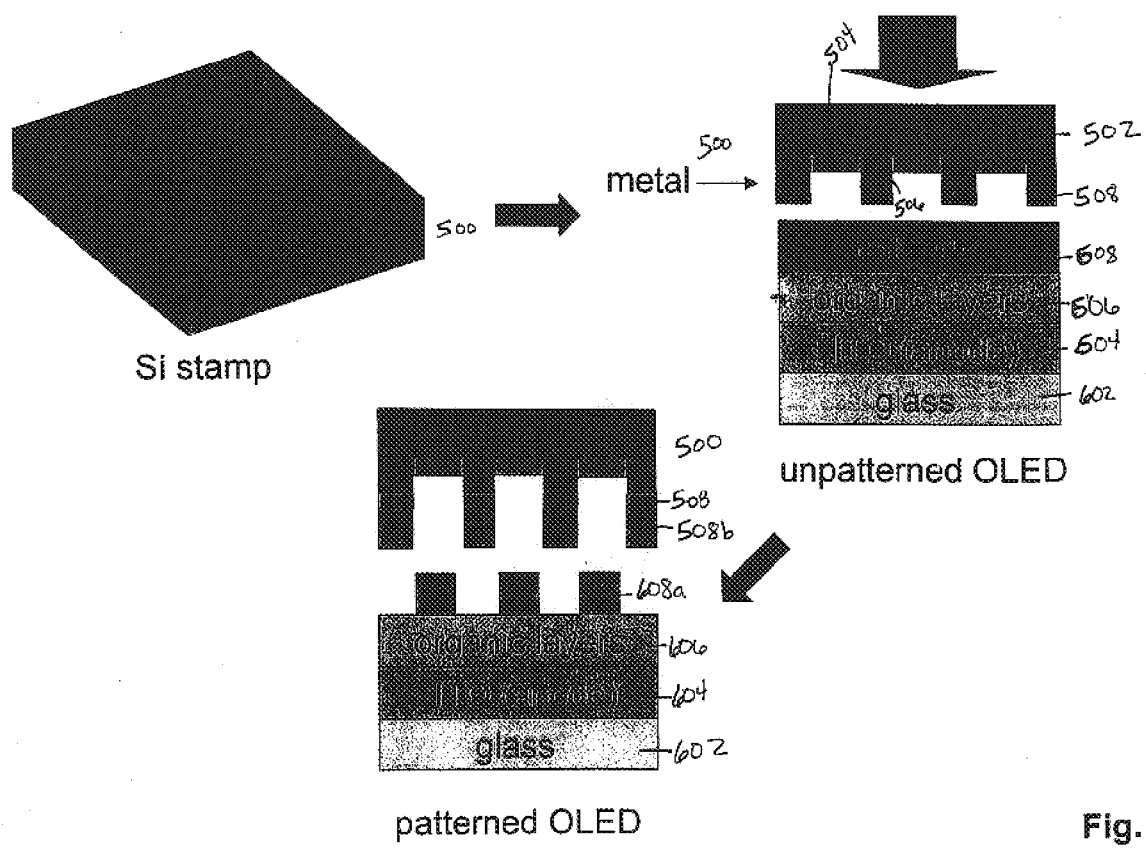
FIG. 5 shows a patterning process by cold welding followed by lift-off as set forth in the examples, where silicon stamps having a metal layer are pressed onto unpatterned OLEDs to obtain patterned OLEDs.

In the present examples, a patterning process as shown in FIG. 5 was used. First, an unpatterned small molecule OLED structure having an anode 604, one or more organic layers 606 and a cathode 608 was vacuum deposited over the entire substrate area 602. Prior to film deposition, the glass substrate 602 was precoated with ~1500 Å thick, transparent, conductive (20Ω/□) indium tin oxide (ITO) anode was cleaned, followed by 2 minutes of oxygen plasma treatment (31 W RF power, 50 sccm oxygen flow rate, 100 mTorr chamber pressure). The OLED was a single heterostructure device having a 500 Å thick hole transport layer of 4,4'-bis[N-(1-napthyl)-N-phenyl-amino]biphenyl(α-NPD) as hole transport material and a 500 Å thick electron transport and light emitting layer of tris-(8-hydroxyquinoline)aluminum ($Alq_3$) as both electron transport and light emitting material. The cathode consisted of a 400 Å thick Mg:Ag alloy cathode capped with a 300 Å thick Ag layer.

To pattern the OLEDs, a stamp (or die) 500 was formed. In forming the stamp, a silicon wafer was processed using conventional photolithography. Using $SiO_2$ as a mask, the wafer was etched by chlorine-based reactive ion etching (RIE) and by wet etching (HF—$HNO_3$—$CH_3COOH$ mixture etching). For wet etching, an etchant composition (by volume) of 7%:70%:23% (HF:$HNO_3$:$CH_3$ COOH) was used and the etch rate was ~2 μm/min. The resulting pattern on the silicon stamp was the negative image of a desired OLED pattern. The silicon stamp 702 was coated with a metal coating 708 having a 50 Å thick Cr adhesion layer and a 150 Å~200 Å thick Ag layer, which was deposited by conventional e-beam evaporation.

To create the OLED pattern, the stamp was pressed onto the unpatterned OLEDs to induce cold welding between the OLED cathode and the silver on the stamp. The pressing was performed using an Instron Dynamic Testing System (model 8501), which applies force using a hydraulic actuator. The substrate and the stamp were placed on a lower cylinder-shaped platen and compressive force was applied by moving up the lower platen to a fixed upper platen. The applied force increased from zero to maximum linearly with respect to time, and the maximum force and ramp rate were computer controlled. Throughout the experiment, glass substrates 602 having a size of about 10 mm×10 mm were used.

Figure 6:
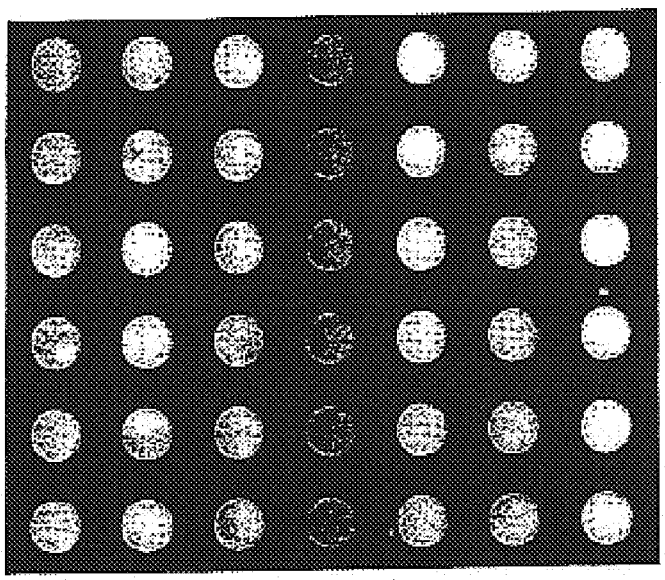
FIG. 6 shows optical micrographs of a 230 $\mu$m diameter dots pattern.
Figure 6:
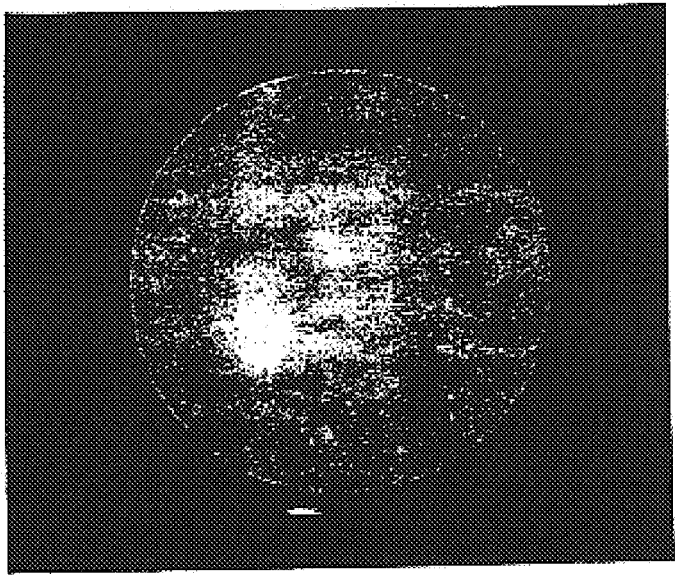

The results for a 230 μm diameter dots pattern are shown in FIGS. 6a and 6b. The ITO layer was not patterned and the maximum force of the pressing was ~35 kN, corresponding to an average pressure of ~290 MPa. The ramp rate was 1 kN/s and the sample was kept under pressure for 5 minutes after the maximum force was reached. Silicon stamps with an etched depth of ~10 μm were used. This depth was chosen to try and prevent possible unintentional contact of the stamp to the cathode layer due to the possible deformation of the glass substrate. This consideration is particularly important with regard to larger patterns. As shown in FIGS. 6a and 6b, a pattern transfer with high yield was achieved.

Figure 7:
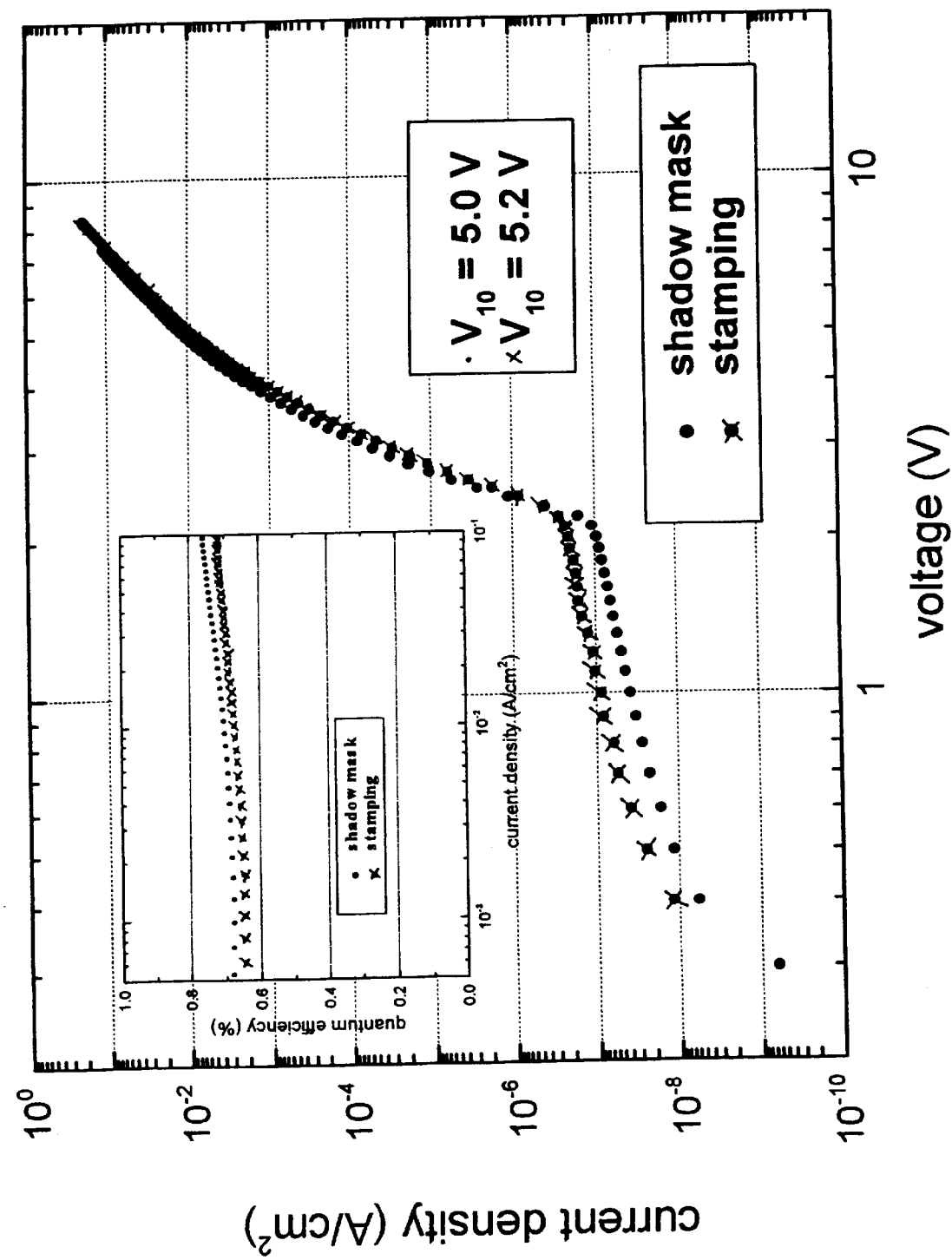
FIG. 7 shows the results of a comparison of OLEDs patterned by a shadow masking technique and OLEDs patterned by the stamping technique of the present invention, as measured by current density vs. voltage characteristics and by quantum efficiency vs. current density.

FIG. 7 compares the 1 mm diameter OLEDs patterned by the present technique with OLEDs patterned using a conventional shadow mask technique. Current density versus voltage (J-V) and external quantum efficiency versus current density are shown in FIG. 7. $V_{10}$ is defined as voltage corresponding to current density of 10 mA/$cm^2$. FIG. 7 shows that no apparent degradation was induced by this method.

Figure 8:
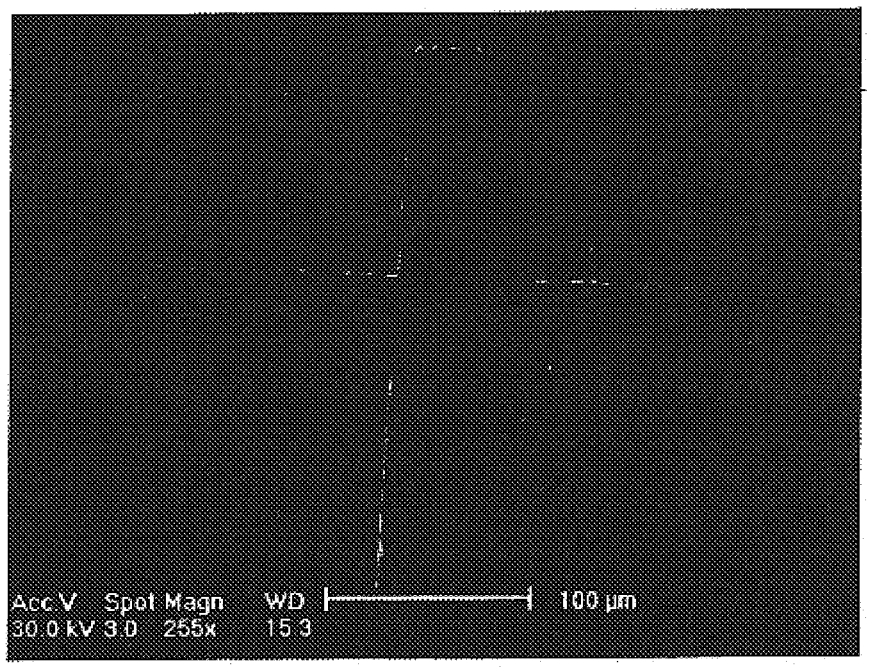
FIG. 8 shows SEM images of the cross pattern with a width of 55 $\mu$m.
Figure 8:
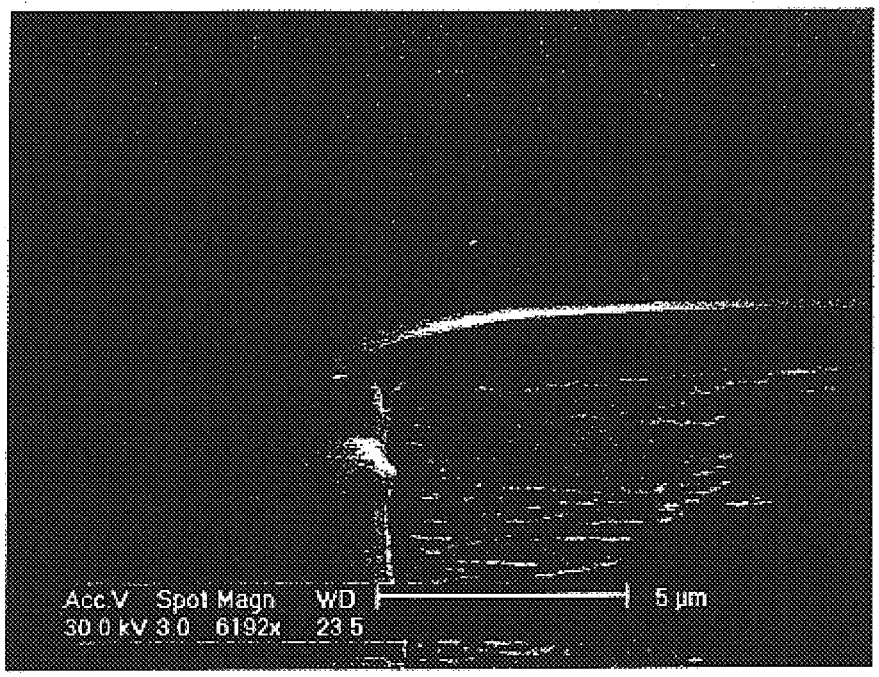

FIGS. 8a and 8b show a cross pattern with a width of 55 μm obtained by the present method. There was no significant peel-off of the cathode. It is noted that some of the organic materials were also removed.

The patterning of the OLEDs in these experiments were performed in ambient laboratory conditions, hence neither the stamps nor the OLEDs were protected from dust, oxygen, water vapor, etc.

Figure 9:
FIG. 9 shows optical micrographs of the passive matrix with 420 $\mu$m×420 $\mu$m pixels.
Figure 9:
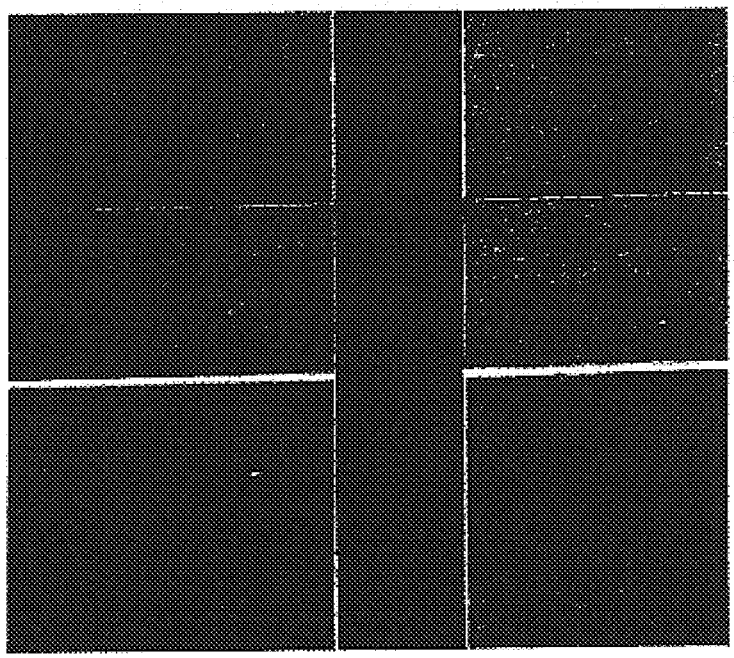
Figure 10:
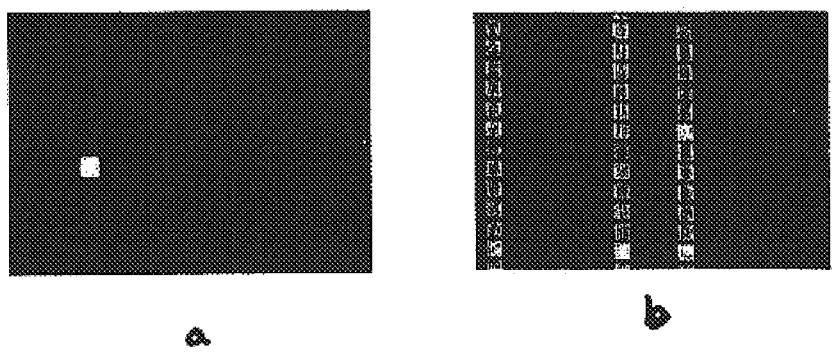
FIG. 10 shows CCD camera images of electroluminescence from single and multiple pixels.

To demonstrate a possible application of the present method to flat panel displays, a passive matrix having a pixel size of 420 μm×420 μm was fabricated. First, parallel lines of a ~1500 Å thick ITO layer were obtained by conventional photolithography and wet etching. After performing a cleaning step, organic single heterostructure and cathode layers were subsequently deposited on the patterned ITO layer (as described above). Next the substrate was pressed perpendicularly with the stamp with a parallel line pattern to obtain a passive matrix. The maximum force applied during the pressing was ~8 kN (i.e., a pressure of ~380 MPa) and the ramp rate was 1 kN/s. The sample was kept under pressure for 5 minutes after the maximum pressure was reached. FIGS. 9a and 9b show the achieved pattern. FIGS. 10a and 10b show CCD camera images of the individually and multiply turned on pixels respectively. For the individually turned on pixel in FIGS. 10a and 10b, the whole column and the whole row were faintly turned on. However, this is believed to be due to reverse leakage current, a problem inherent to the devices.

As two solid surfaces (e.g., the metal layer on the stamp and the cathode of the OLED) are brought into contact, they can be bonded to each other when the interfacial separation is decreased below a critical value, resulting in a single solid. Therefore, to achieve good patterns by this technique, the applied pressure should be high enough to decrease the interfacial separation below the critical value.

The stress distribution in the cathode layer should also be considered. This problem may be considered an elastic contact problem between the silicon stamp and the glass substrate with finite friction. Normal contact stress is very large at the edge of the contact region. It is believed that the cathode layer is locally weakened at the edge of the contact region due to the highly concentrated normal stress. Also, due to the relatively high applied pressure, plastic deformation of the cathode and organic layers should be taken into consideration.

Figure 11:
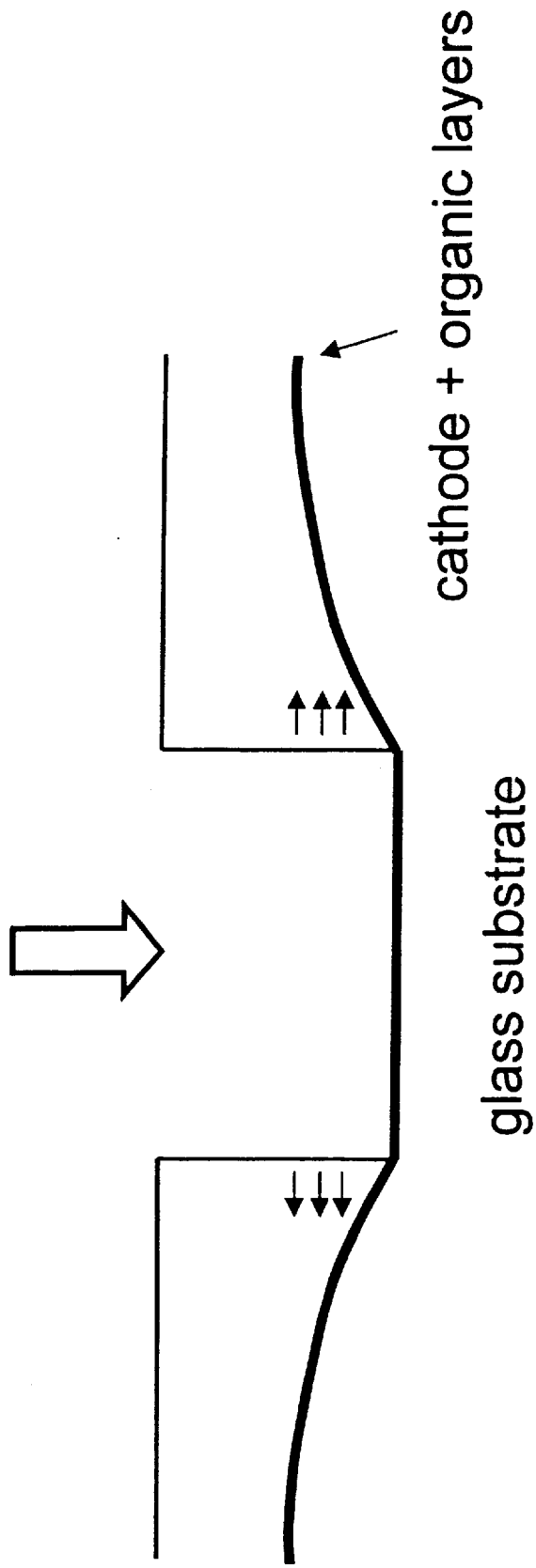
FIG. 11 is a schematic diagram showing elastic deformation of the glass substrate and lateral expansion of the raised part of a stamp.

As applied pressure increases gradually, the raised part of the stamp expands laterally as determined by the applied pressure and poisson ratio. See FIG. 11. This is expected to help local weakening. Therefore, as a result, the fracture along the weakened boundaries occurs upon separation of the stamps from the OLEDs, giving sharp pattern edges. The applied pressure should be high enough to decrease the interfacial separation of silver layers below the critical value and also to induce the local weakening of the metal layers along the edges of the contact region. An optimum pressure was determined to be about 250 MPa to about 400 MPa.

When the stamp is applied to the device, the substrate of the device may bend such that the device bows into the depressed portions of the die. Contact between the device and the depressed portion of the die is undesirable, and could lead to the removal of layers that are supposed to remain on the device. To avoid such contact, various parameters may be controlled. For example, stiffer substrates and lower forces applied to the die are two factors that may be used to eliminate such contact. Alternatively, if a flexible substrate is used, the substrate may be mounted on a stiff support structure, if desired. Still other means may be used to keep the flexible substrate sufficiently rigid to maintain the desired tolerances. Another important factor is the geometry of the die. In particular, by increasing the depth of the depressed portions, or by decreasing the separation between the raised portions, such contact may be avoided. It is believed that a depth of about 10 microns per 1 millimeter of separation is preferred to avoid such contact, although this ratio may change depending upon the particular substrate and forces.

Full Color OLED By Stamping

In one embodiment of the invention, several different patterning steps may be performed with patterned dies. As a result, devices such as full color OLED displays may be fabricated. For example, a full color OLED may be fabricated as illustrated in FIGS. 12–18.

Figure 12:
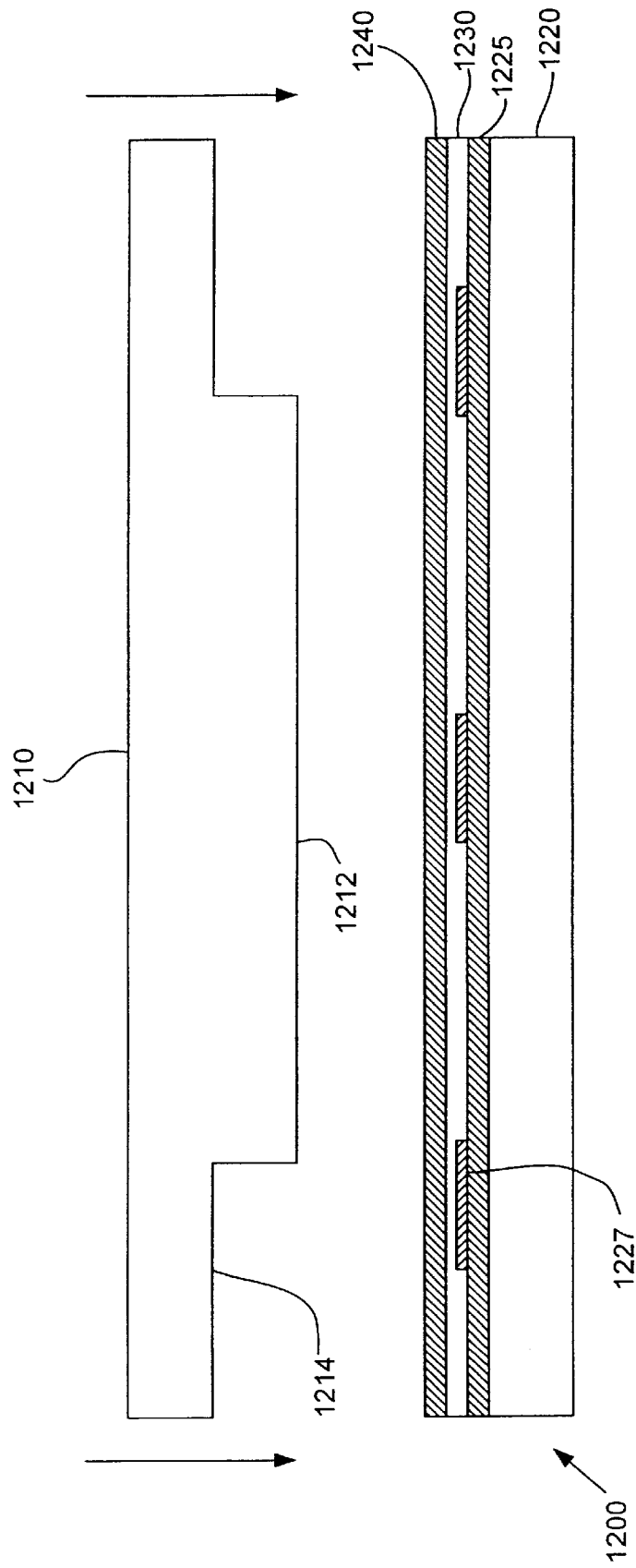
FIG. 12 shows a device partially fabricated in accordance with an embodiment of the invention.

FIG. 12 shows a partially fabricated device 1200. A substrate 1220 has a first electrode 1225 and insulating strips 1227 fabricated thereon using conventional patterning methods. A blanket organic layer 1230 and a blanket electrode layer 1240 are then blanket deposited over the underlying features. A patterned die 1210, having raised portions 1212 and depressed portions 1214, is then pressed onto device 1200. Blanket electrode layer 1240 is then patterned in a manner similar to that described previously with respect to FIGS. 1–3.

Figure 13:
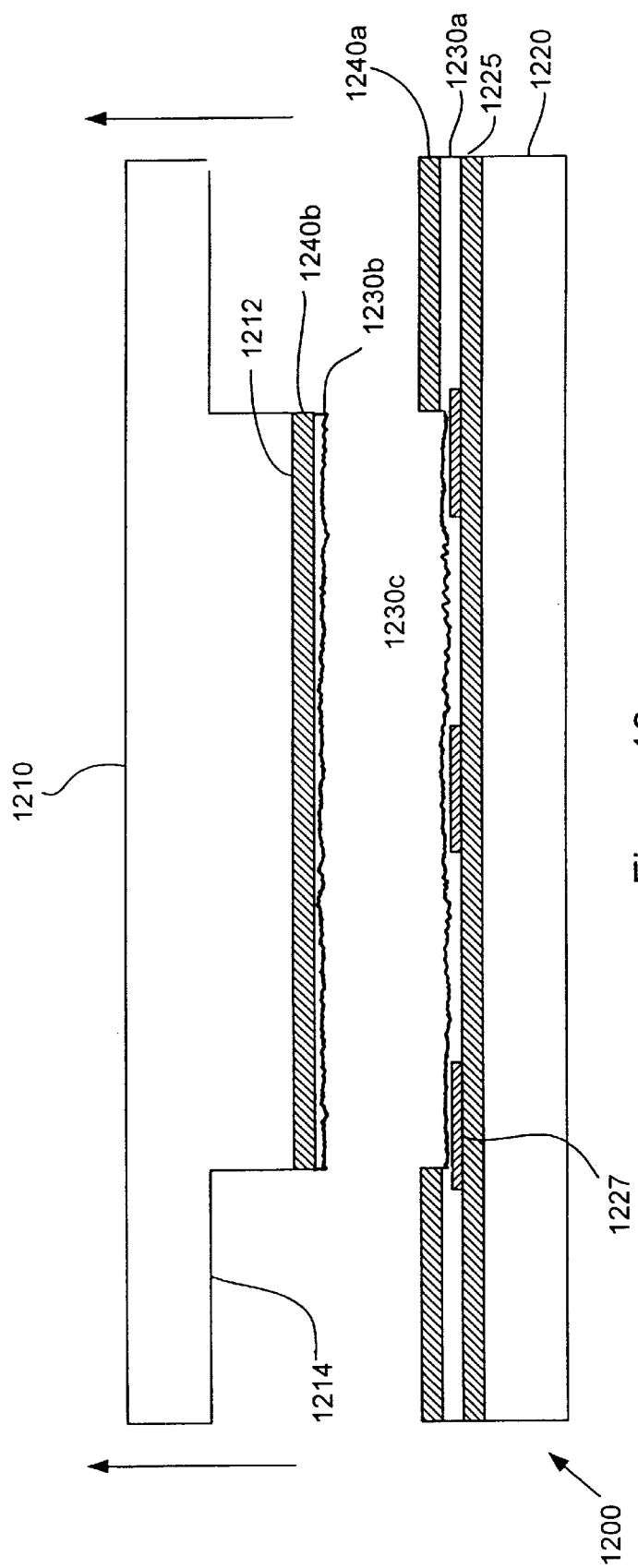
FIG. 13 shows the partially fabricated device of FIG. 12 after further processing.

FIG. 13 shows the partially fabricated device 1200 of FIG. 12 after further processing. In particular, patterned die 1210 has been pressed onto device 1200 and removed. Removed portion 1240b of blanket electrode layer 1240 has adhered to and been removed by die 1210. Removed portion 1230b of blanket organic layer 1230 has adhered to portion 1240b, and has also been removed by die 1210. Portion 1230c of blanket organic layer 1230 has remained on device 1200, but remains exposed by the removal of removed portion 1240b. First operational organic layer 1230a remains on device 1200, in electrical contact with first electrode 1225. Second electrode 1240a also remains on device 1200, in electrical contact with first organic layer 1230a.

FIG. 13 depicts removed portion 1230b of blanket organic layer 1230 adhered to die 1210, and portion 1230c of blanket organic layer 1230 remaining on device 1200. However, depending on the adhesion of the various layers, the part of blanket organic layer 1230 underlying portion 1240b of second electrode layer 1240 may be entirely removed by die 1210, i.e., there is no portion 1230c remaining after die 1210 is removed. Alternatively, the part of organic layer 1230 underlying portion 1240b of second electrode layer 1240 may remain entirely on device 1200, i.e., there is no portion 1230b.

Figure 14:
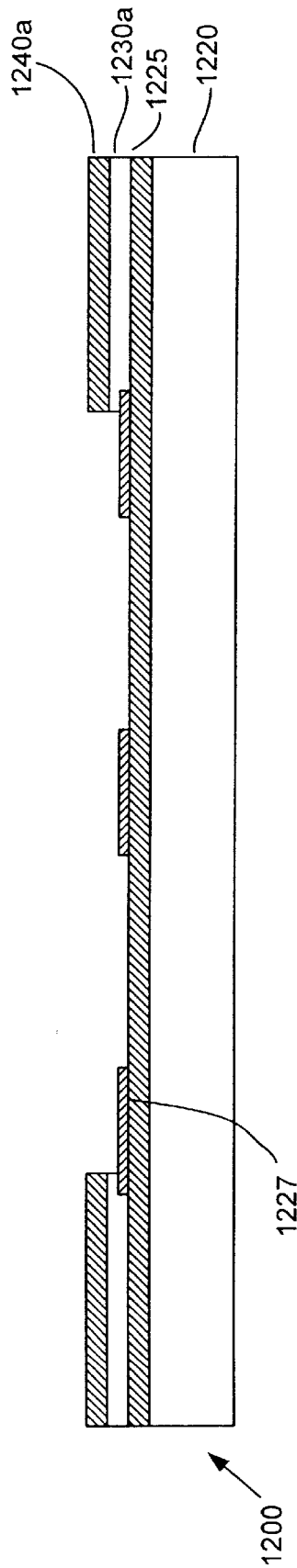
FIG. 14 shows the partially fabricated device of FIG. 13 after further processing.

FIG. 14 shows the partially fabricated device 1200 of FIG. 13 after further processing. Any portion 1230c of blanket organic layer 1230 that remained after die 1210 was lifted away has been removed. The removal of portion 1230c may be accomplished by any suitable technique that does not damage device 1200. In particular, the removal process should be chosen to minimize damage to electrode 1240a, and any reagent used should not be reactive with electrode 1240a. Preferably, reactive ion etching is used to remove portion 1230c. Reactive ion etching with a combination of $CF_4$ and $O_2$ or with just $O_2$ may be used. A combination of $CF_4$ and $O_2$ is preferable when portion 1230c includes Alq, which is rapidly removed by this combination. A thin protective layer of gold may be deposited as a part of electrode 1240a to provide protection from the removal process, particularly if reactive ion etching with $CF_4$ and $O_2$ is used.

Insulating strips 1227 may prevent the formation of possible shorts between first electrode 1220 and the other electrodes during stamping with dies 1210, 1510 and 1710. Insulating strips 1227 run parallel to second electrode 1540a, and may be made of any non-conductive material that provides suitable protection. Preferably, insulating strips 1227 are made of $SiN_x$ or $SiO_2$. Insulating strips 1227 may not be necessary, and may be omitted from device 1200, if the formation of such shorts is within acceptable tolerances even without insulating strips 1227.

Figure 15:
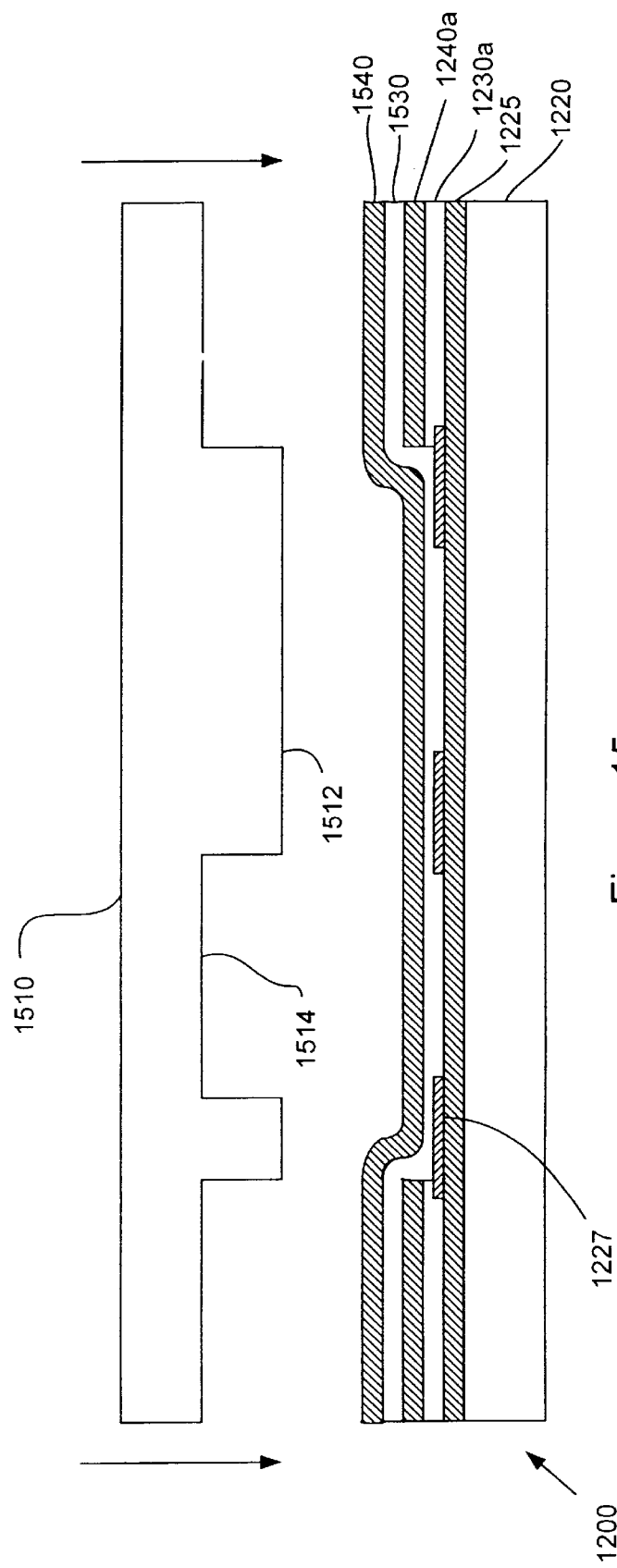
FIG. 15 shows the partially fabricated device of FIG. 14 after further processing.

FIG. 15 shows the partially fabricated device 1200 of FIG. 14 after further processing. A blanket organic layer 1530 and a blanket electrode layer 1540 have been blanket deposited over the underlying layers. A patterned die 1510 having raised portions 1512 and depressed portions 1514 is positioned over device 1200. A process similar to that described in FIGS. 12–14 is used to remove the portions of blanket organic layer 1530 and blanket electrode layer 1540 that correspond to raised portions 1512 of die 1510.

Figure 16:
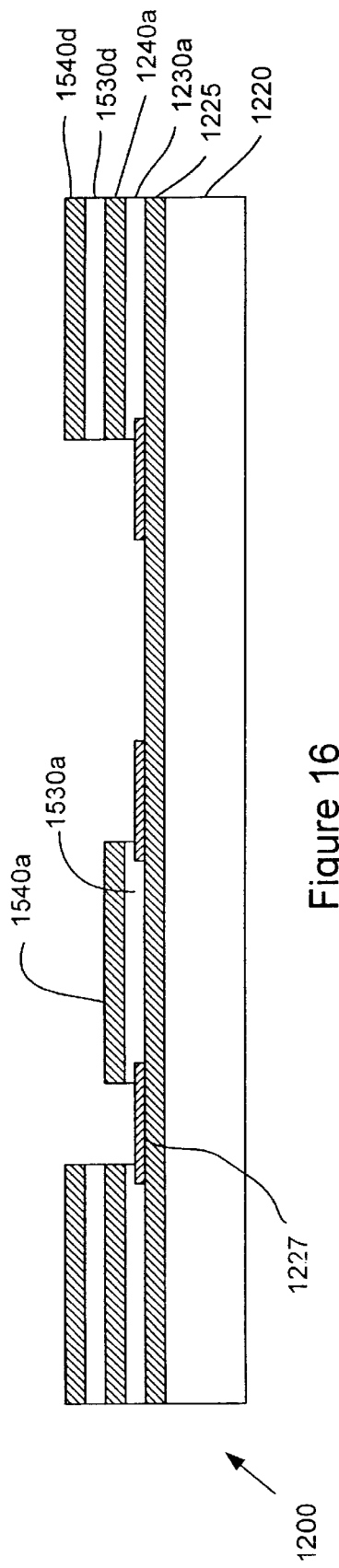
FIG. 16 shows the partially fabricated device of FIG. 15 after further processing.

FIG. 16 shows the partially fabricated device 1200 of FIG. 15 after further processing, in particular after die 1510 has been removed and any remaining exposed portion of blanket organic layer 1530 has been removed. Second operational organic layer 1530a of blanket organic layer 1530 remains on device 1200, in electrical contact with first electrode 1225. Third electrode 1540a remains on device 1200, in electrical contact with second operational organic layer 1530a. Residual portion 1530d of blanket organic layer 1530, and residual portion 1540d of blanket electrode layer 1540, also remain on top of second electrode 1240a.

FIGS. 15 and 16 show that die 1510 has depressed portions 1514 above previously fabricated operational organic layer 1230a and second electrode 1240a. These depressed portions lead to the fabrication of residual portions 1530d and 1540d. These residual portions are not necessary to the operation of device 1200. However, it is believed that having a depressed portion, such as depressed portion 1514, above previously fabricated areas that will eventually be functioning parts of device 1200, such as operational organic layer 1230a and second electrode 1240a, minimizes damage to these previously fabricated functioning parts during subsequent stamping procedures. If previously fabricated functioning parts can withstand the pressure of stamping and still function within desired parameters, it may not be necessary to protect them in this manner.

Figure 17:
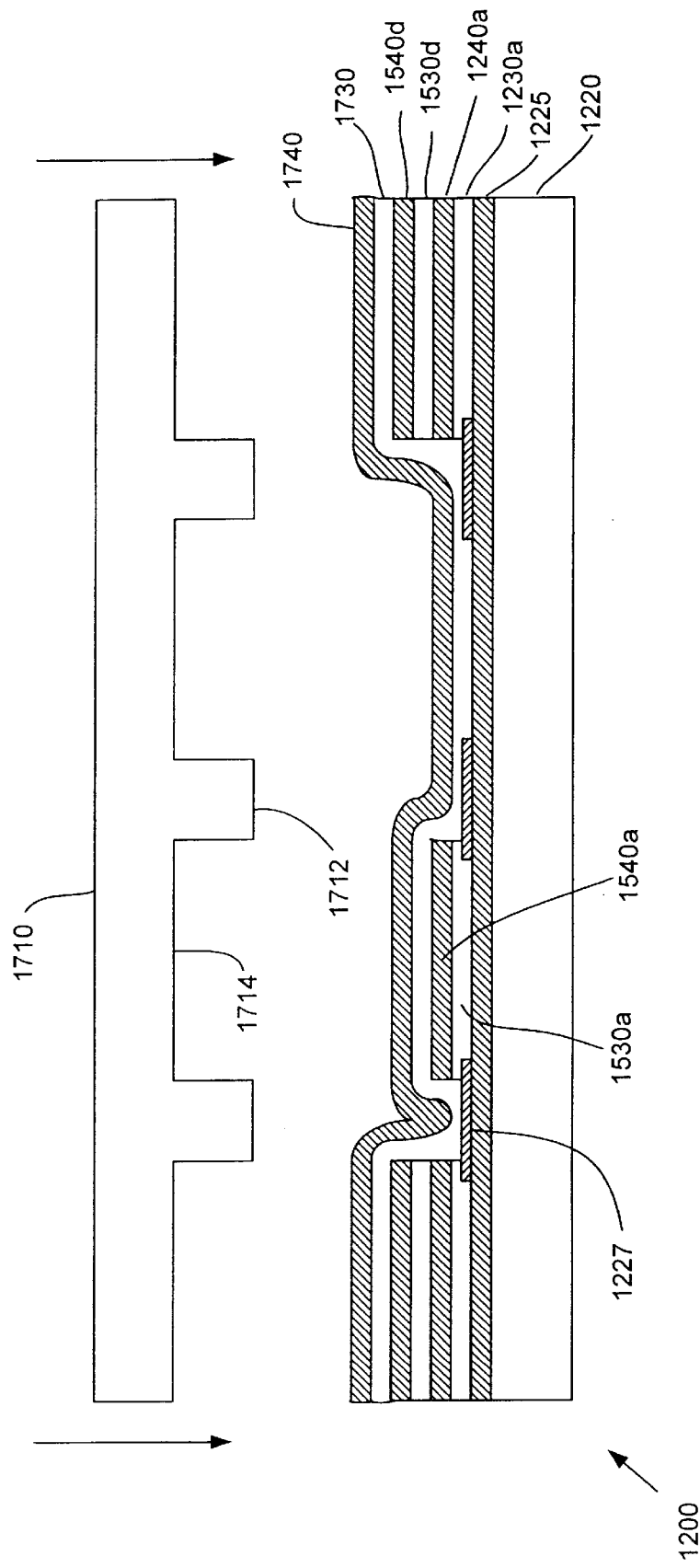
FIG. 17 shows the partially fabricated device of FIG. 16 after further processing.

FIG. 17 shows the partially fabricated device 1200 of FIG. 16 after further processing. A blanket organic layer 1730 and a blanket electrode layer 1740 have been blanket deposited over the underlying layers. A patterned die 1710 having raised portions 1712 and depressed portions 1714 is positioned over device 1200. A process similar to that described in FIGS. 12–14 is used to remove the portions of blanket organic layer 1730 and blanket electrode layer 1740 that correspond to raised portions 1712 of die 1710.

Figure 18:
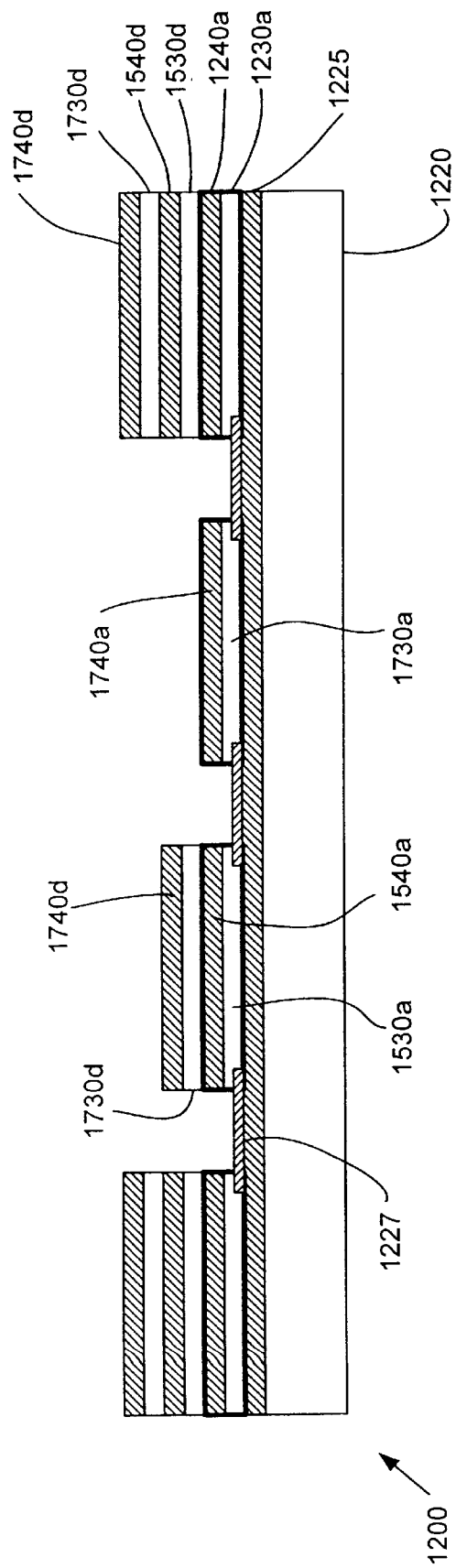
FIG. 18 shows the partially fabricated device of FIG. 17 after further processing, to create a fully fabricated device.

FIG. 18 shows the device 1200 of FIG. 17 after further processing, to create a fully fabricated device. In particular, die 1710 has been removed, and any remaining exposed portion of second organic layer 1730 has been removed. Third operational organic layer 1730a of blanket organic layer 1730 remains on device 1200, in electrical contact with first electrode 1225. Fourth electrode 1740a remains on device 1200, in electrical contact with third operational organic layer 1730a. Residual portion 1730d of blanket organic layer 1730, and residual portion 1740d of blanket electrode layer 1740, also remain on top of third electrode 1540a, as well as on top of residual portion 1540d.

Figure 19:
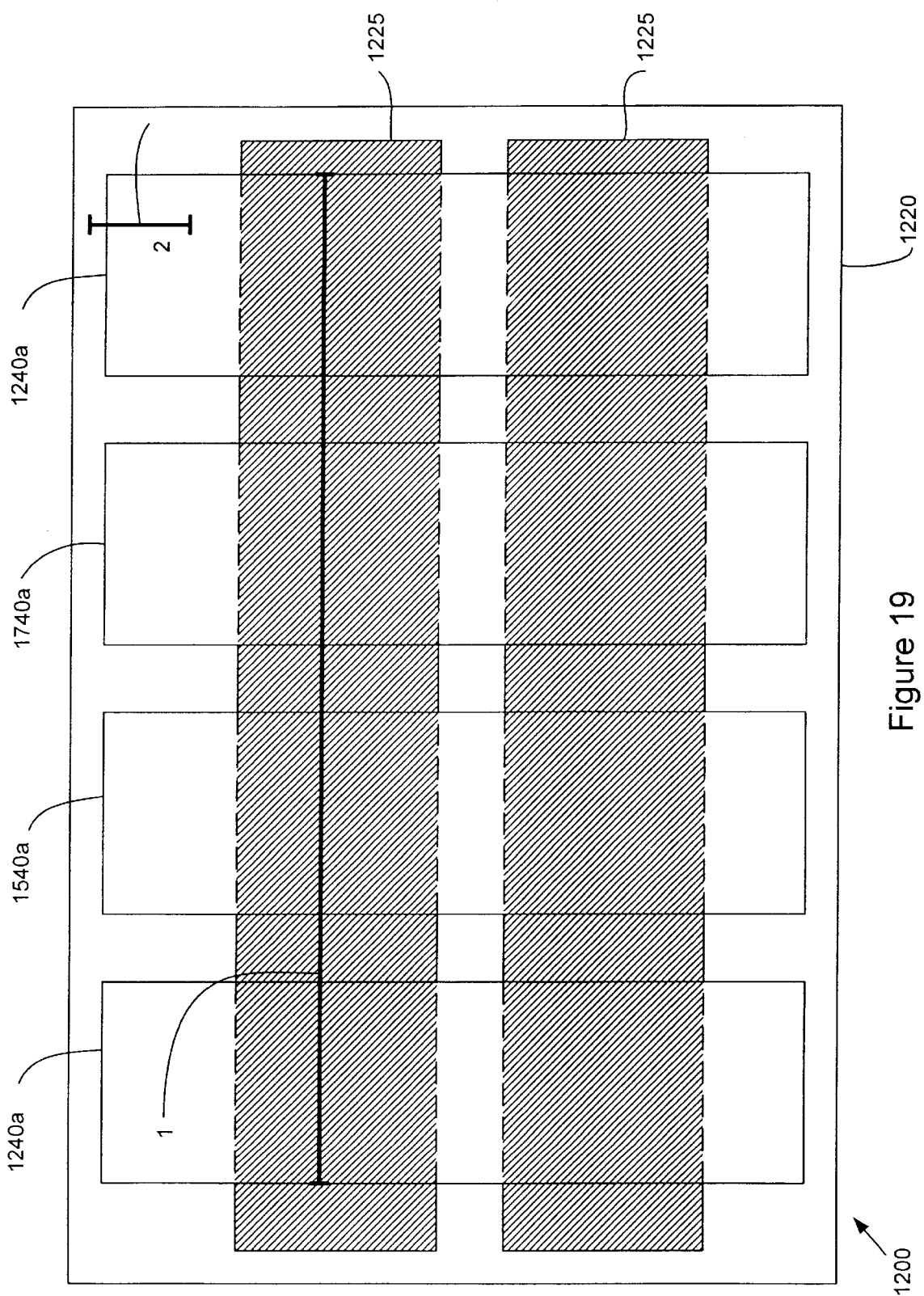
FIG. 19 shows a top view of the device of FIG. 18.

FIG. 19 shows a top view of the device of FIG. 18. FIGS. 12–18 are taken from a cross section of FIG. 19 along line 1. For clarity, only the operational electrodes, i.e., first electrode 1225, second electrode 1240a, third electrode 1540a, and fourth electrode 1740a, are illustrated in FIG. 19. As illustrated in FIG. 18, several of these electrodes are actually covered by residual layers, not shown in FIG. 19.

Figure 20:
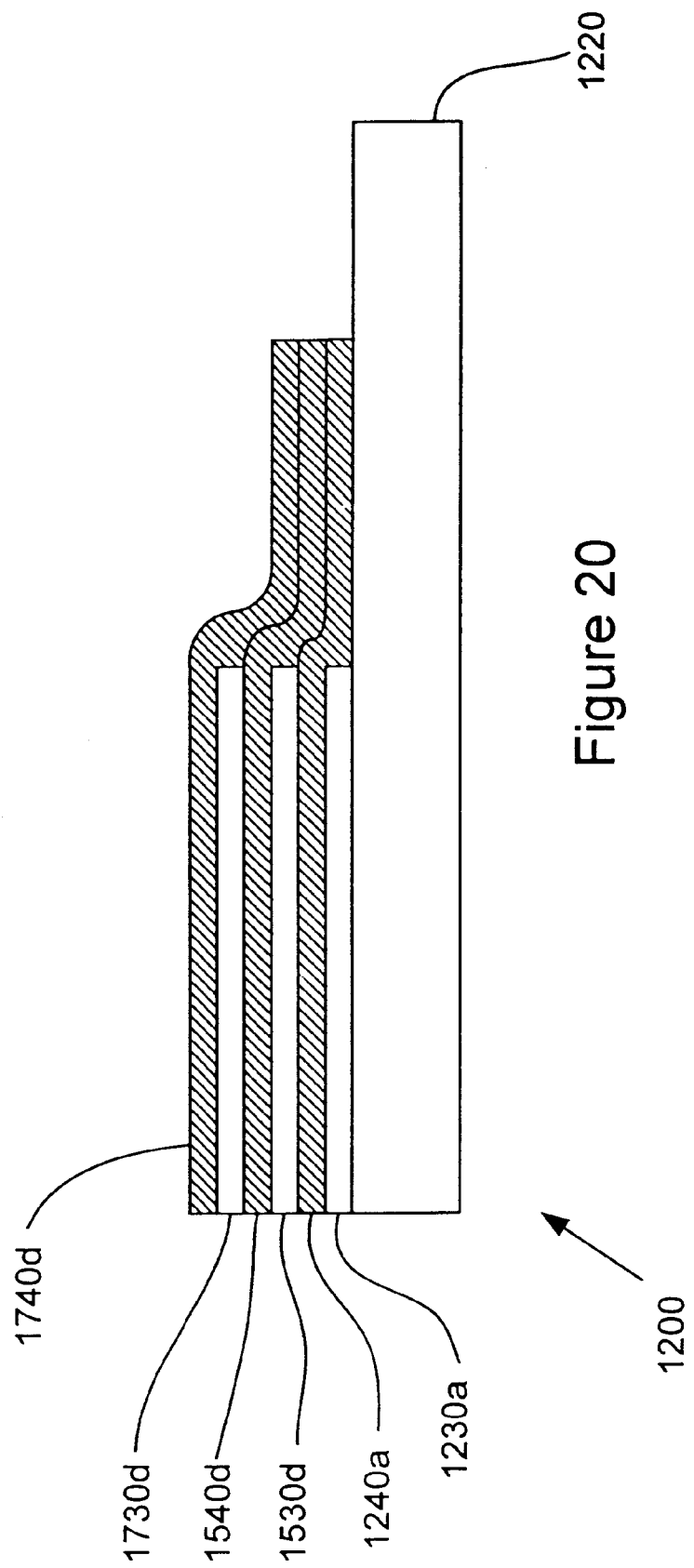
FIG. 20 shows an illustration of the connection of metal layers at an edge of a device as achieved by edge masking.

Preferably, any residual portions of blanket electrode layers 1540 and 1740, i.e., residual portions 1540d and 1740d, are electrically connected to the operational electrode layers running directly below and parallel to them, to avoid unwanted electrically floating residual portions of blanket electrode layers, and/or to avoid voltage differences across residual organic portions. In particular, with reference to FIG. 18, second electrode 1240a is preferably electrically connected to residual portion 1540d and residual portion 1740d that are directly above second electrode 1240a. Similarly, third electrode 1540a is preferably electrically connected to residual portion 1740d directly above third electrode 1540a. This electrical connection may be achieved in a number of ways. FIG. 20 shows an illustration of one possible way to achieve this connection through edge masking. In particular, blanket layers 1230, 1240, 1530, 1540, 1730 and 1740 are deposited through shadow masks having one large opening in the center, such that the edges of device 1200 are masked. The masks used to deposit blanket electrode layers 1240, 1540 and 1740 have openings larger than those used to deposit blanket organic layers 1230, 1530 and 1730. As a result, residual portions 1540d and 1740d are in electrical contact with second electrode 1230 at the edge of device 1200. Third electrode 1530 is similarly in electrical contact with its overlying residual portion 1740d.

Electrical contact between electrodes 1230a and 1530a with overlying residual portions 1530d and 1730d may also be achieved without the use of edge masking by driving a conductive rod through the electrodes and any overlying residual portions at the edge of the device.

Operational organic layers 1230a, 1530a and 1730a emit light when current is passed through them. In particular, first operational organic layer 1230a emits light when a current is applied between first electrode 1225 and second electrode 1240a. Second operational organic layer 1530a emits light when a current is applied between first electrode 1225 and third electrode 1540a. Operational organic layer 1230a emits light when a current is applied between first electrode 1225 and second electrode 1240a. Device 1200 as shown in FIG. 18 may be a full color OLED. For example, operational organic layer 1230a may emit red light, operational organic layer 1530a may emit green light, and operational organic layer 1730 may emit blue light.

Although various embodiments of the invention are illustrated with simplified organic layers and electrodes, additional layers and sublayers may be present. For example, operational organic layer 1230a may comprise multiple sublayers as described with respect to FIG. 2. Additional layers may also be present. For example, a hole injecting layer may also be present, such as described in U.S. Pat. No. 5,998,803 to Forrest et al., which is incorporated by reference. The presence of such a hole injecting layer between an electrode and an organic layer may block physical contact between the electrode and the organic layer, but does not change the fact that the electrode and organic layer are in electrical contact. Additional layers as known to the art may also be present.

The embodiment of FIG. 12–20 maybe practiced using dies, materials, and process parameters similar to those described with respect to FIGS. 1–11.

Preferably, each of the organic layers and each electrode is about 1000 Å thick. Preferably, first electrode 1225 is ITO, although any other suitable transparent electrode may be used. Preferably, second electrode 1240a, third electrode 1540a, and fourth electrode 1740a comprise a layer of Mg/Ag alloy about 1000 Å thick, coated with a layer of Au about 100 Å thick. However, any suitable electrode may be used, such as a LiF/Al electrode.

In the embodiment of FIGS. 12–20, the die should be properly positioned during the stamping process. In particular, the die should be positioned accurately with respect to features already on device 1200 during the stamping illustrated in FIGS. 15 and 17. This alignment may be achieved using techniques know to the art, such as optical alignment using IR light projected through the bottom of the device, fiducial alignment using light scattering, and any other suitable technique. To the extent that the blanket electrode layers interfere with such alignment techniques, edge masking may be used during deposition to provide an area of the device that is free from the blanket deposition of metal.

Further Examples

Two arrays of OLEDs were sequentially fabricated on a single substrate. Although no stamping was used, organic layers were removed by reactive ion etching in between the fabrication of the two arrays. This demonstrates that the first array did not suffer adverse effects from exposure to reactive ion etching, and that the second array could be successfully fabricated using bottom electrodes that had been exposed to reactive ion etching.

In particular, a conventional substrate covered with a layer of ITO was obtained. This layer of ITO was not patterned, and serves as the common bottom electrode (anode) of each device in each of the arrays. As a result, this example is not intended to demonstrate an array where each pixel is individually addressable, but rather to demonstrate that working OLEDs may be fabricated. A 500 Å thick layer of α-NPD was blanket deposited over the ITO, followed by a 500 Å thick layer of Alq, to form the organic layers of a conventional single heterostructure OLED. The top electrodes (cathodes) of the first array only were then deposited through shadow masks. The first array was confined to less than half of the substrate.

Figure 21:
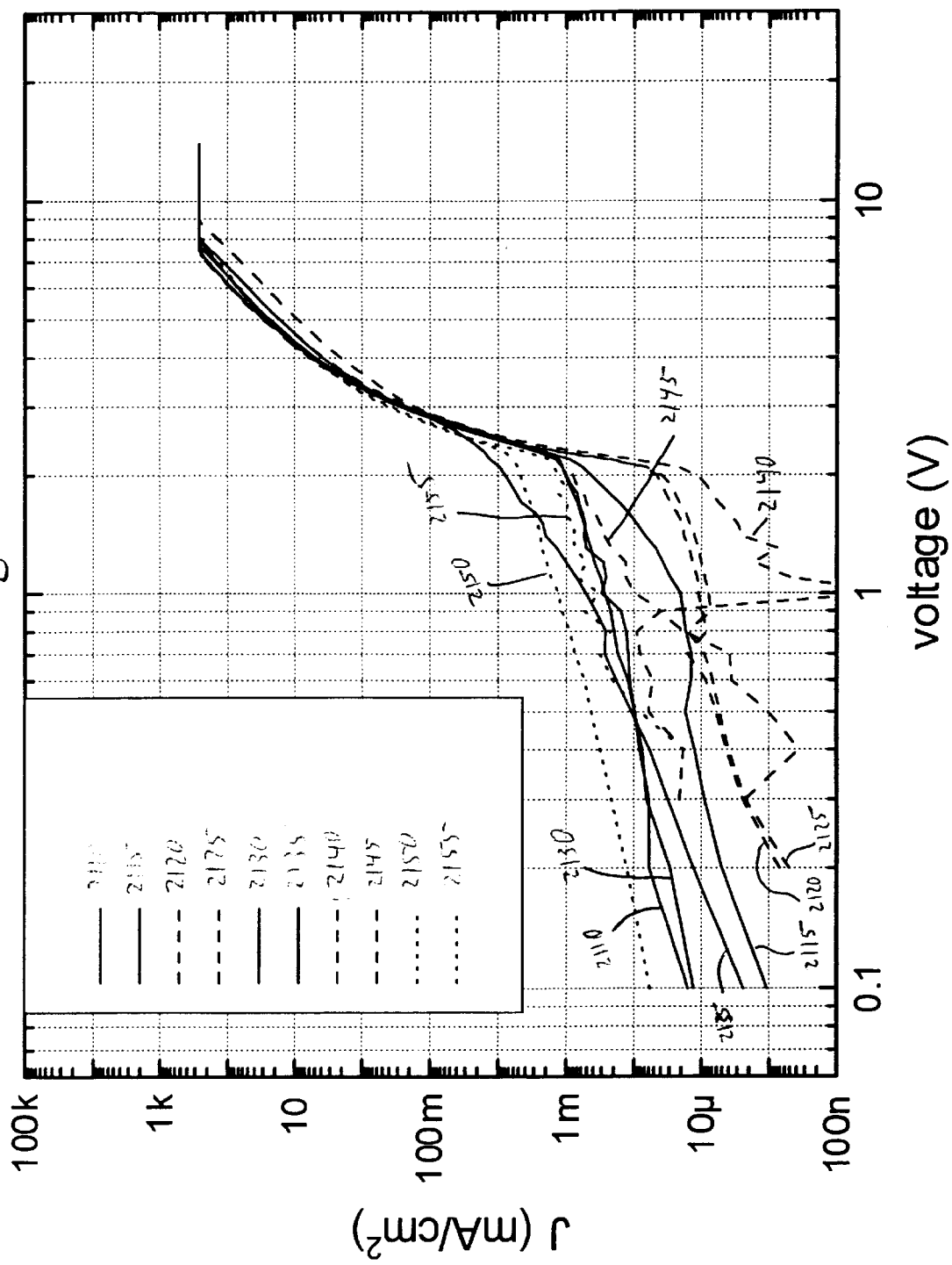
FIG. 21 shows the current vs. voltage of actual devices.
Figure 22:
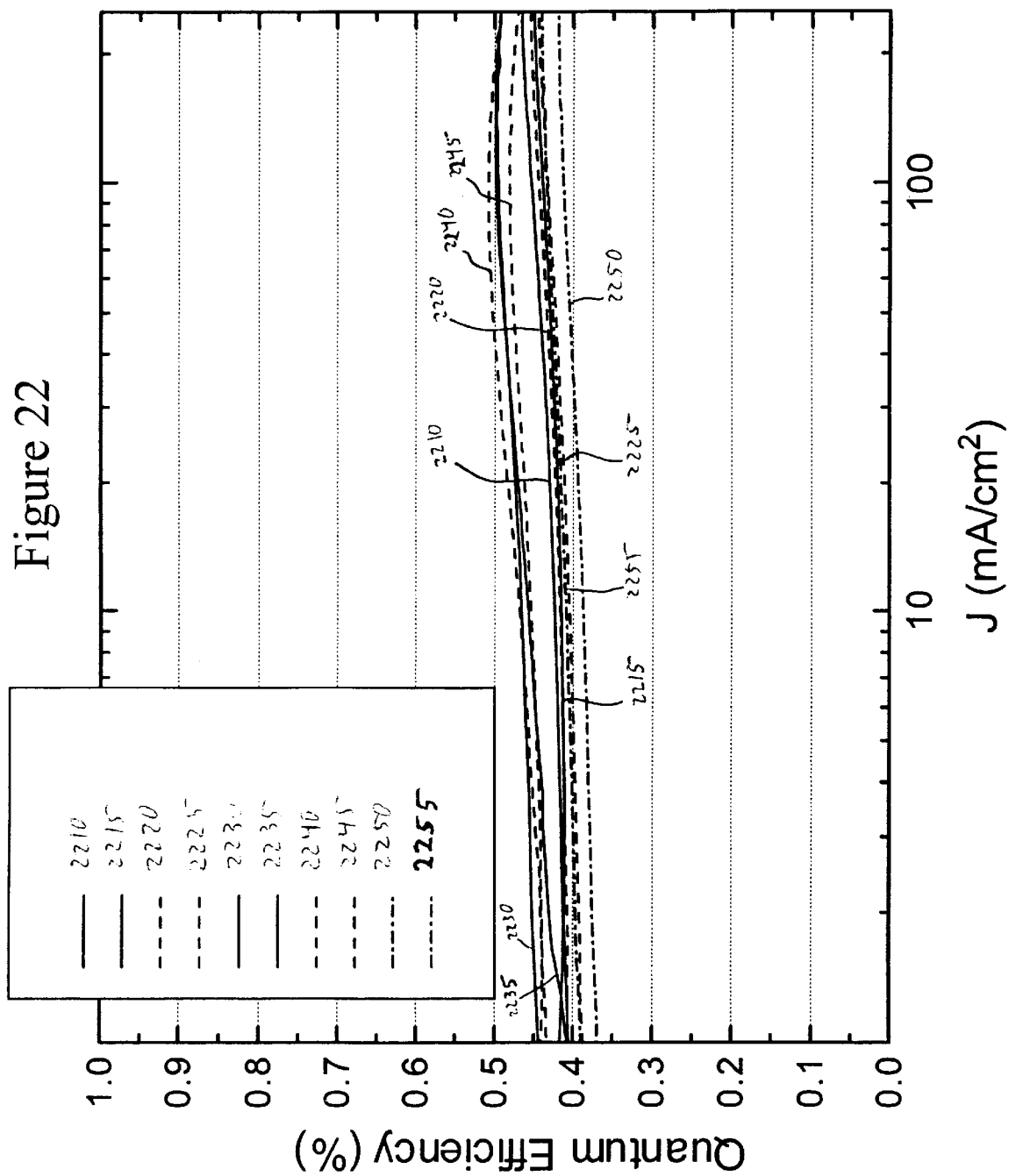
FIG. 22 shows the quantum efficiency vs. current of actual devices.

The characteristics of the first array of devices were measured. FIG. 21 shows the current vs. voltage, and FIG. 22 shows the quantum efficiency vs. current of these devices. In particular, lines 2110 and 2115 of FIG. 21 show the current vs. voltage, and lines 2210 and 2215 of FIG. 22 show the quantum efficiency vs. current.

Reactive ion etching with a combination of $CF_4$ and $O_2$ was then used to remove the exposed organic layers, i.e., the parts of the organic layers not covered by the top electrodes of the first array of devices. The characteristics of the first array of devices were then measured again. Lines 2120 and 2125 of FIG. 21 show current vs. voltage, and lines 2220 and 2225 of FIG. 22 show the quantum efficiency vs. current. The closeness of lines 2120 and 2125 to lines 2110 and 2115, as well as the closeness of lines 2220 and 2225 to lines 2210 and 2215, show that the reactive ion etch did not adversely affect the devices in the first array.

A second 500 Å thick layer of α-NPD was then blanket deposited over the entire substrate, including the first array of devices, followed by a second 500 Å thick layer of Alq, to form the organic layers of a conventional single heterostructure OLED. The top electrodes of the second array were then deposited through a shadow mask onto a portion of the substrate not occupied by the first array.

The characteristics of the second array of devices were measured. Lines 2130 and 2135 of FIG. 21 show the current vs. voltage, and lines 2230 and 2235 of FIG. 22 show the quantum efficiency vs. current. The closeness of lines 2130 and 2135 to lines 2120 and 2125, as well as the closeness of lines 2230 and 2235 to lines 2210 and 2215, demonstrate the successful fabrication of an OLED using a bottom electrode that has been previously coated with organic material, and then cleaned with reactive ion etching.

Reactive ion etching with a combination of $CF_4$ and $O_2$ was then used to remove the exposed organic layers, i.e., the parts of the organic layers not covered by the top electrodes of the second array of devices. This reactive ion etching also removed the organic material that had been deposited over the first array of devices. The characteristics of the second array of devices were then measured again. Lines 2140 and 2145 of FIG. 21 show current vs. voltage, and lines 2240 and 2245 of FIG. 22 show the quantum efficiency vs. current, for the second array of devices. The characteristics of the first array of devices were also measured again. Lines 2150 and 2155 of FIG. 21 show current vs. voltage, and lines 2250 and 2255 of FIG. 22 show the quantum efficiency vs. current for the first array of devices.

The closeness of lines 2140, 2145, 2150 and 2155 to the other lines on FIG. 21, as well as the closeness of lines 2240, 2245, 2250 and 2255 to the other lines on FIG. 22, show that the second reactive ion etch did not adversely affect the devices in either array.

Conclusion

The method of the present invention has several advantages over previously reported patterning techniques. For example, the present method is very cost-effective, because the stamps are reusable. In embodiments where the stamps have metal layers, the stamps are reusable after the metal layers are removed by wet etching. The method of the present invention also offers high throughput. Large areas, such as display panels, can be patterned in one step.

Additionally, the method of the present invention is well suited for roll-to-roll fabrication processes that use flexible plastic substrates. By using roller stamps, large area patterning can be performed more easily for flexible substrates, since optimum pressure can be applied with smaller forces due to decreased contact areas. The method of the present invention allows simple, cost-effective and high throughput fabrication of OLEDs and other electronic devices and can be applied to the fabrication of flat panel displays, for example.

The embodiment of FIGS. 12–20 provides several unexpected and advantageous features over the other embodiments of the present invention. The embodiment of FIGS. 12–20 allows different organic layers to be incorporated into different devices in the same array. For example, operational organic layer 1230a can be different from operational organic layer 1530a, which can in turn be different from operational organic layer 1730a. This allows for the fabrication of a full color display without the use of down-conversion layers. The use of multiple stamps is one unexpected and advantageous feature of the embodiment of FIGS. 12–20. Another is the ability to remove residual organic layers after stamping without damaging existing devices, and such that the first electrode 1225 exposed by such removal may be used for the fabrication of further devices.

While the present invention is described with respect to particular examples and preferred embodiments, it is understood that the present invention is not limited to these examples and embodiments. In particular, the present invention is not limited to OLEDs, and may be applied to a wide variety of electronic devices. In addition, with respect to OLEDs, the present invention is not limited to the particular examples and embodiments described. The present invention as claimed therefore includes variations from the particular examples and preferred embodiments described herein, as will be apparent to one of skill in the art.

What is claimed is:

1. A method comprising:

providing a pattern-bearing die including a pattern having a metallic surface over the pattern;

contacting the metallic surface of the pattern-bearing die with a first portion of a metallic surface layer disposed over a substrate to effect cold-welding between the metallic surface of the pattern-bearing die and the first portion of the metallic surface layer disposed over the substrate; and removing the die from the substrate.

2. The method of claim 1 wherein the first portion of the metallic surface layer disposed over the substrate is removed from the substrate and a second portion of the metallic surface layer remains disposed over the substrate to form a pattern thereover.

3. The method of claim 1 wherein at least one organic layer is present between the substrate and the metallic surface layer disposed over the substrate.

4. The method of claim 3 wherein a conductive electrode layer is present between the substrate and the at least one organic layer.

5. The method of claim 1 wherein the method is used to fabricate a passive array of organic light emitting devices, each device having a bottom electrode, an organic light emitting layer formed over the bottom electrode, and a top electrode formed over the organic light emitting layer.

6. A passive array of organic light emitting devices formed by a method including providing a pattern-bearing die including a pattern having a metallic surface over the pattern;

contacting the metallic surface of the pattern-bearing die with a first portion of a metallic surface layer disposed over a substrate to effect cold-welding between the metallic surface of the pattern-bearing die and the first portion of the metallic surface layer over the substrate, and removing the die from the substrate.

* * * * *